Figure 1:
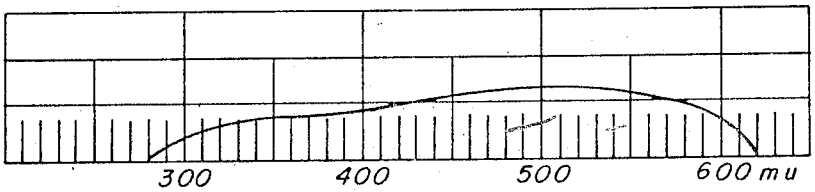
Figure 2:
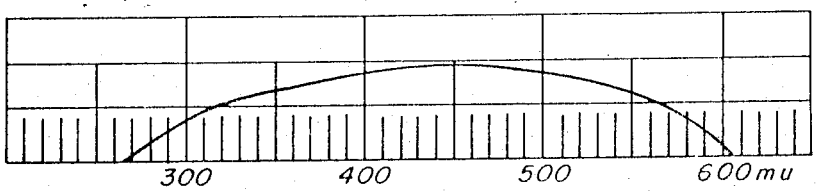

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 28, 1970

876 O.G. 816

T876,007

DIAZONIUM COMPOUNDS AND PHOTOGRAPHIC COMPOSITIONS

Frederick J. Rauner, Kodak Park Works, Rochester, N.Y. 14650

Filed Jan. 28, 1970, Ser. No. 6,444
**Int. Cl. G03c *1/54***
U.S. Cl. 96—91
1 Sheet Drawing. 14 Pages Specification

A light sensitive composition comprising a dye, e.g. a pyrylium dye, and an aromatic diazonium salt can be coated on a support material to prepare a photographic element. After an imagewise exposure, development can be accomplished by washing the exposed element with a solvent, such as water, to remove dye from the unexposed areas, leaving a monochrome image in the exposed areas.

July 28, 1970 F. J. RAUNER T876,007

DIAZONIUM COMPOUNDS AND PHOTOGRAPHIC COMPOSITIONS

Filed Jan. 28, 1970

N-METHYL-N-PHENYL-N'-(4-DIAZOBENZYLIDENE) HYDRAZONE 2,6 DIPHENYL-4-(4'-DIAZOPHENYL) THIAPYRYLIUM PERCHLORATE

FREDERICK J. RAUNER
INVENTOR.

BY Dennis M. DeLeo

ATTORNEY